United States Patent
Khalifa et al.

(10) Patent No.: US 10,026,719 B2
(45) Date of Patent: Jul. 17, 2018

(54) ELECTRONIC ASSEMBLIES INCLUDING ELECTRONIC DEVICES MOUNTED ON NON-PLANAR SUBRATES

(71) Applicant: Teledyne Reynolds, Inc., Thousand Oaks, CA (US)

(72) Inventors: Colleen Louise Khalifa, San Juan Capistrano, CA (US); Harry George Kellzi, Glendale, CA (US)

(73) Assignee: Teledyne Reynolds, Inc., Thousand Oaks, CA (US)

( * ) Notice: Subject to any disclaimer, the term of this patent is extended or adjusted under 35 U.S.C. 154(b) by 53 days.

(21) Appl. No.: 14/959,072

(22) Filed: Dec. 4, 2015

(65) Prior Publication Data
US 2017/0162549 A1     Jun. 8, 2017

(51) Int. Cl.
| | |
|---|---|
| *H01L 23/02* | (2006.01) |
| *H01L 23/34* | (2006.01) |
| *H01L 23/12* | (2006.01) |
| *H01L 25/10* | (2006.01) |

(52) U.S. Cl.
CPC ...... *H01L 25/105* (2013.01); *H01L 2225/107* (2013.01); *H01L 2225/1076* (2013.01)

(58) Field of Classification Search
CPC ........... H01L 25/105; H01L 2225/1076; H01L 2225/107; H01L 25/117; H01L 25/041; H01L 25/065; H01L 25/07; H01L 25/165; H01L 23/12; H01L 25/0756; H01L 25/162
USPC .................. 257/686, 723, 778, 731
See application file for complete search history.

(56) References Cited

U.S. PATENT DOCUMENTS

| | | | |
|---|---|---|---|
| 5,028,473 A | 7/1991 | Vitriol et al. | |
| 7,633,165 B2 | 12/2009 | Hsu et al. | |
| 7,683,459 B2 | 3/2010 | Ma et al. | |
| 7,968,043 B2 | 6/2011 | Ito et al. | |
| 8,968,637 B2* | 3/2015 | Krueger | B28B 1/00 264/607 |
| 2004/0188812 A1 | 9/2004 | Koschmieder et al. | |
| 2009/0056978 A1* | 3/2009 | Miura | H01L 21/4807 174/250 |
| 2010/0102430 A1* | 4/2010 | Lee | H01L 24/73 257/690 |
| 2013/0189935 A1* | 7/2013 | Nair | H01Q 1/38 455/90.2 |

FOREIGN PATENT DOCUMENTS

EP       1416546 A1    5/2004

OTHER PUBLICATIONS

DuPont GreenTape Low Temperature Co-Fired Ceramic System, Design and Layout Guidelines, Nov. 2009.
Micro Systems Engineering, LTCC Substrates, Nov. 2014.
DuPont Microcircuit Materials, DuPont Green Tape Material System, Design and Layout Guidelines, 2003.
Murrata Manufacturing Co., Ltd., Low Temperatyre Co-Fired Ceramics (LTCC) Multi-Layer Module Boards, Jan. 22, 2014.

(Continued)

*Primary Examiner* — Kimberly Rizkallah
*Assistant Examiner* — Dilinh Nguyen
(74) *Attorney, Agent, or Firm* — K&L Gates LLP

(57) ABSTRACT

The electronic assemblies described in this specification are characterized by a non-planar low-temperature co-fired ceramic substrate on which an electronic device is mounted.

20 Claims, 12 Drawing Sheets

(56) References Cited

OTHER PUBLICATIONS

Birol, Hansu, "Fabrication of Low Temperature Co-Fired Ceramic (LTCC)-Based Sensor and Micro-Fluidic Structures," Thesis No. 3696, Ecole Polytechnique Federale de Lausanne, 2007.

Lim, Michele Hui Fern, "Low Temperature Co-fired Ceramics Technology for Power Magnetics Integration," Dissertation, Virginia Polytechnic Institute and State University, Nov. 17, 2008.

* cited by examiner

ELECTRONIC ASSEMBLIES INCLUDING ELECTRONIC DEVICES MOUNTED ON NON-PLANAR SUBRATES

BACKGROUND

The information described in this background section is not admitted to be prior art.

Three-dimensional integrated circuits (3D-ICs) comprise vertically stacked semiconductor dies optionally positioned on interposer substrates. The vertically stacked semiconductor dies can be electrically connected to each other using through-silicon vias (TSVs) that extend through the thickness dimensions of the semiconductor dies and/or the optional interposer substrates, which are both generally made from silicon wafers. TSVs provide a higher performance interconnect between dies and other electronic devices in 3D-ICs and other 3D microelectronic packages. The higher performance derives from the higher via densities and shorter connection lengths provided by TSV-based architectures, which produce higher transmission speeds and lower power consumption. TSV-based 3D-ICs and other 3D microelectronic packages can also improve form factor with decreased system volume, mass, and footprint.

Notwithstanding their performance advantages, the use of TSVs in 3D-ICs and other 3D microelectronic packages can be disadvantageous in a number of respects. For instance, TSV-based 3D-ICs and package designs are relatively complex compared to conventional 2D counterparts and require more sophisticated design techniques and tools. In an active die, the physical size of a TSV (e.g., 15-30 micrometer diameter) is very large compared to the transistors that surround it (e.g., 20-40 nanometers). This difference in scale significantly affects routing, cell placement, and transistor stress, among many other design variables. Additionally, the embedded location of TSVs within dies and/or interposers, the smaller circuit/package footprint, and the more compact volume of 3D-ICs and packages, combine to increase the generation of heat and the resulting dissipation challenges. Moreover, the fabrication of TSVs is more complicated than conventional interconnect structures. These issues combine to make TSV-based systems more expensive than systems with conventionally interconnected components.

SUMMARY

This specification generally relates to electronic assemblies and, more specifically, to electronic assemblies comprising non-planar low-temperature co-fired ceramic substrates on which electronic devices are mounted.

In one example, an electronic assembly comprises a first substrate comprising a low-temperature co-fired ceramic and at least one internal electrical conductor. A first electronic device is mounted on the first substrate and is electrically coupled to the at least one internal electrical conductor in the first substrate. The electronic assembly also comprises a second substrate comprising a non-planar low-temperature co-fired ceramic and at least one internal electrical conductor. The second substrate is mounted on the first substrate and is positioned over the first electronic device. The at least one internal electrical conductor in the second substrate is electrically coupled to the at least one internal electrical conductor in the first substrate. A second electronic device is mounted on the second substrate and is electrically coupled to the at least one internal electrical conductor in the second substrate.

In one example, an electronic assembly comprises a first substrate comprising a low-temperature co-fired ceramic and at least one internal electrical conductor. A first semiconductor integrated circuit die is mounted on the first substrate and is electrically coupled to the at least one internal electrical conductor in the first substrate. The electronic assembly also comprises a second substrate comprising a low-temperature co-fired ceramic, at least one internal electrical conductor, and at least two non-planar sections separated by a planar section. The second substrate is mounted on the first substrate at the at least two non-planar sections and is positioned over the first semiconductor integrated circuit die. The at least one internal electrical conductor in the second substrate is electrically coupled to the at least one internal electrical conductor in the first substrate. A second semiconductor integrated circuit die is mounted on the planar section of the second substrate and is electrically coupled to the at least one internal electrical conductor in the second substrate. The first and second semiconductor integrated circuit dies are electrically coupled through the first and second substrates.

It is understood that the invention described in this specification is not necessarily limited to the examples summarized in this Summary.

BRIEF DESCRIPTION OF THE DRAWINGS

Various features and characteristics of the invention described in this specification may be better understood by reference to the accompanying figures, in which.

Figure 1A:
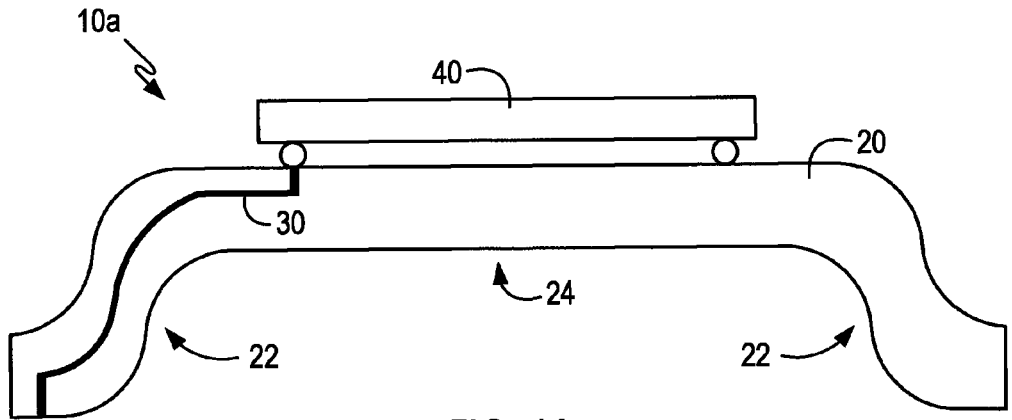
FIGS. 1A-1F are cross-sectional schematic diagrams of electronic assemblies comprising an electronic device mounted on a substrate comprising a non-planar low-temperature co-fired ceramic and at least one internal electrical conductor, wherein the substrates also comprise two S-shaped arcuate end sections separated by a planar section.

The reader will appreciate the foregoing features and characteristics, as well as others, upon considering the following detailed description of the invention according to this specification.

DESCRIPTION

In this specification, including the claims, spatial terms (e.g., top, bottom, vertical, horizontal, above, below, over, under, and the like) used to describe the relative orientation, location, or positioning of various components are not to be construed as limited to any specific external frame of reference.

As described above, TSV-based 3D-ICs and other 3D microelectronic packages are complex to design and fabricate and, therefore, are relatively expensive compared to conventional 2D circuits and packages. Nevertheless, 3D-ICs and other 3D microelectronic packages provide improved performance (e.g., increased bandwidth, reduced latency, and lower power consumption), which drives the adoption of 3D designs. The electronic assemblies described in this specification provide 3D circuit and package design capability without the complexity and expense of TSVs.

The electronic assemblies described in this specification are characterized by a non-planar low-temperature co-fired ceramic substrate on which an electronic device is mounted.

As used in this specification, the term "electronic device" means a physical component of an electronic system that affects the electrons and/or associated fields in a manner consistent with the intended function of the electronic system. Electronic devices include, but are not necessarily limited to, semiconductor integrated circuit wafers, semiconductor integrated circuit dies, integrated circuit chips (e.g., application-specific integrated circuit (ASIC) chips) and chip scale packages (e.g., system on a chip, SoC), multichip modules, memory modules, surface-mount devices (SMDs), integrated passive devices (IPDs), radio frequency (RF) modules, and the like.

As used in this specification, the term "non-planar" describes substrates having major surfaces with at least a section that is three-dimensionally shaped and not flat. Accordingly, "non-planar" substrates may have planar sections, but are not entirely flat, and have at least one non-flat section.

As used in this specification, the term "low-temperature co-fired ceramic," or "LTCC," means a multi-layer glass/ceramic composite material made from individual layers or tapes that are collated, aligned, stacked, laminated, and co-fired at a temperature of less than 1000° C. to produce a monolithic multi-layer piece of material. Low-temperature co-fired ceramics generally comprise a combination of alumina ceramic material (i.e., $Al_2O_3$) and glass material (e.g., $CaO—Al_2O_3—SiO_2—B_2O_3$). Low-temperature co-fired ceramic materials are available from suppliers including E.I. DuPont de Nemours & Company (Inc.), Wilmington, Del., USA (DuPont GreenTape™ low-temperature co-fired ceramic systems) and Murata Manufacturing Co., Ltd., Kyoto, Japan (LFC® Series and AWG/SWG Series). Low-temperature co-fired ceramics can be used to produce electrically interconnecting substrates by forming and filling vias in the individual layer, and printing conductors on the individual layers, which form internal electrical conductors when the individual layers are collated, aligned, stacked, laminated, and co-fired into a monolithic piece of material. See, e.g., DuPont Microcircuit Materials, DuPont Green Tape™ Material System Design and Layout Guidelines, November 2009 (available at: http://www.dupont.com/content/dam/assets/products-and-services/electronic-electrical-materials/assets/datasheets/prodlib/GreenTape_Design_Layout_Guidelines.pdf, last retrieved Sep. 30, 2015), which is incorporated-by-reference into this specification.

Referring to FIGS. 1A-1F, electronic assemblies 10a-10f comprise a substrate 20 comprising a non-planar low-temperature co-fired ceramic and at least one internal electrical conductor 30-30e embedded within the LTCC substrate material. The substrate 20 comprises two S-shaped arcuate sections 22 separated by a planar section 24. The electronic assemblies 10a-10f also comprise electronic devices 40-40e mounted on the substrates 20 and electrically coupled to the internal electrical conductors 30-30e. The electronic devices 40-40e can be mounted on the substrates 20 at any location in the planar section 24, and in any operable number, with internal electrical conductors provided in the planar sections 24 of the substrates 20 at corresponding locations on the planar surfaces.

Figure 1B:
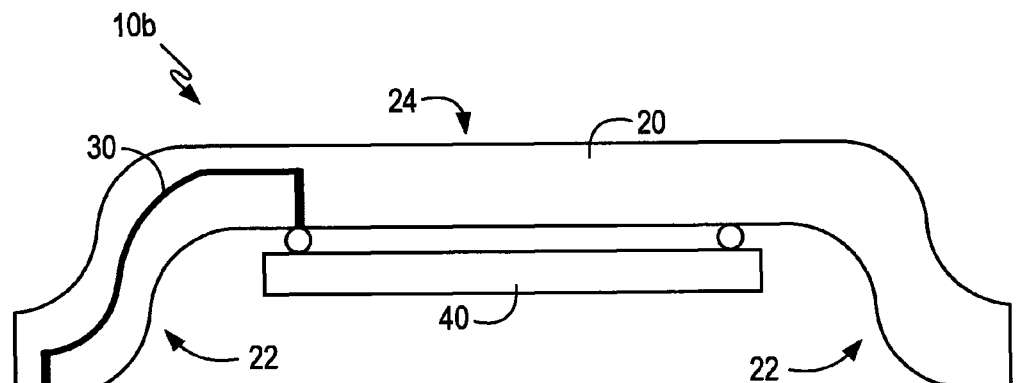
Figure 1C:
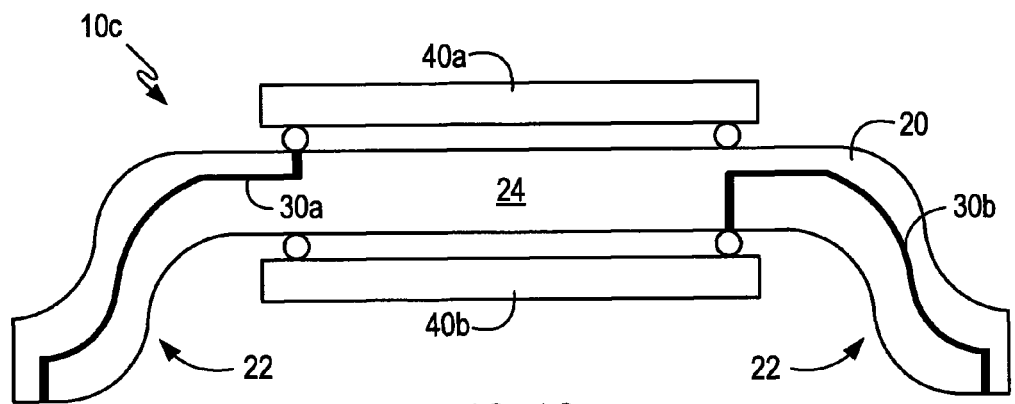
Figure 1D:
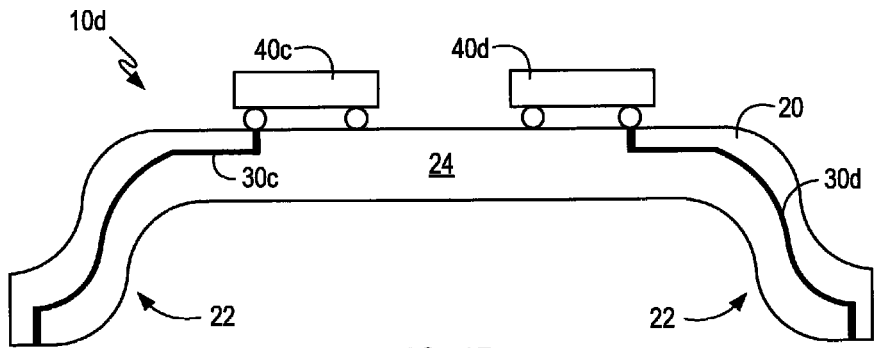
Figure 1E:
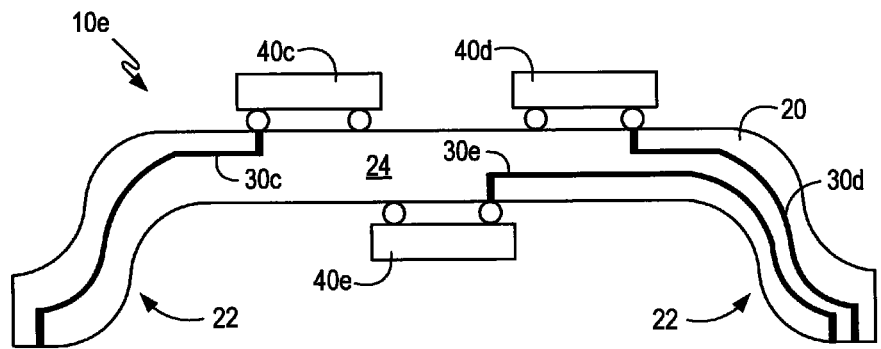
Figure 1F:
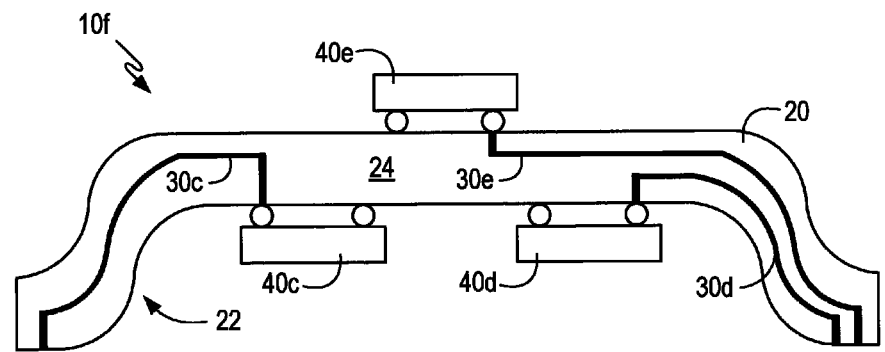

For example, as shown in FIG. 1A, the electronic device 40 is mounted on the top side of the substrate 20 and electrically coupled to the internal electrical conductor 30. As shown in FIG. 1B, the electronic device 40 is mounted on the bottom side of the substrate 20 and electrically coupled to the internal electrical conductor 30. As shown in FIG. 1C, two electronic devices 40a and 40b are respectively mounted on the top side and the bottom side of the substrate 20 and electrically coupled to the internal electrical conductors 30a and 30b, respectively. As shown in FIG. 1D, two electronic devices 40c and 40d are both mounted on the top side of the substrate 20 and electrically coupled to the internal electrical conductors 30c and 30d, respectively. As shown in FIG. 1E, the two electronic devices 40c and 40d are both mounted on the top side of the substrate 20 and electrically coupled to the internal electrical conductors 30c and 30d, respectively, and a third electronic device 40e is mounted on the bottom side of the substrate 20 and electrically coupled to the internal electrical conductor 30e. As shown in FIG. 1F, the two electronic devices 40c and 40d are both mounted on the bottom side of the substrate 20 and electrically coupled to the internal electrical conductors 30*c* and 30*d*, respectively, and the third electronic device 40*e* is mounted on the top side of the substrate 20 and electrically coupled to the internal electrical conductor 30*e*.

Figure 2A:
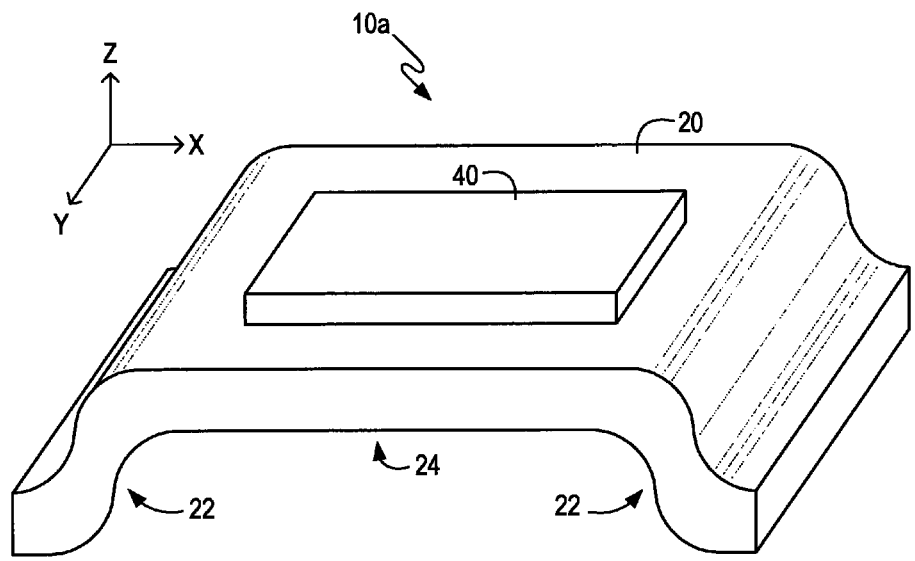
FIG. 2A is a perspective view schematic diagram of the electronic assembly shown in FIG. 1A.
Figure 2B:
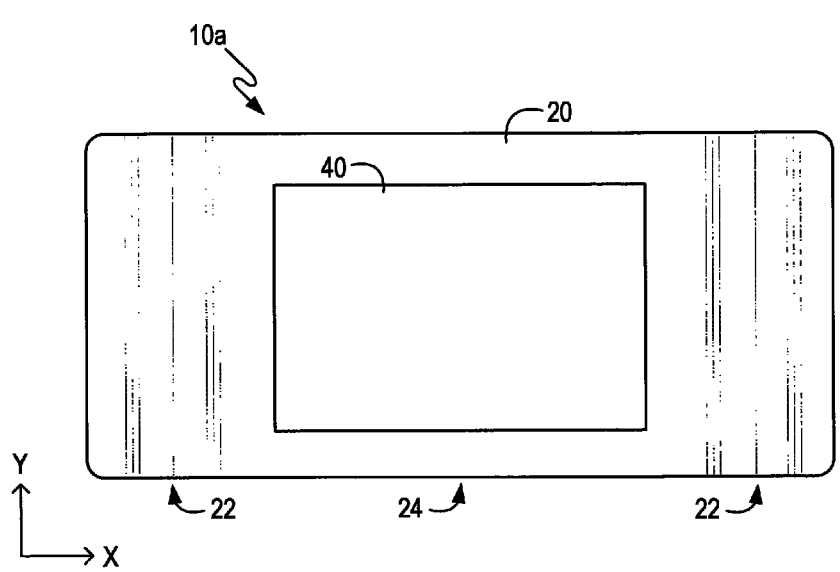
FIG. 2B is a top view schematic diagram of the electronic assembly shown in FIG. 2A.

The substrates 20 shown in FIGS. 1A-1F comprise two arcuate sections 22 separated by a planar section 24. Referring to FIGS. 2A and 2B, which further show the electronic assembly 10*a* shown in FIG. 1A, the two arcuate sections 22 of the substrate 20 are located at opposite ends of the planar section 24 (the view of the electronic assembly 10*a* shown in FIG. 1A is a cross-section in the X-Z plane as shown in FIG. 2A). The location of the two arcuate sections 22 at opposite ends of the planar section 24 facilitates the mounting of the non-planar substrate 20 on another substrate (described below) and the functioning of the substrate 20 as an electrically interconnecting standoff between two or more electronic devices.

Figure 3A:
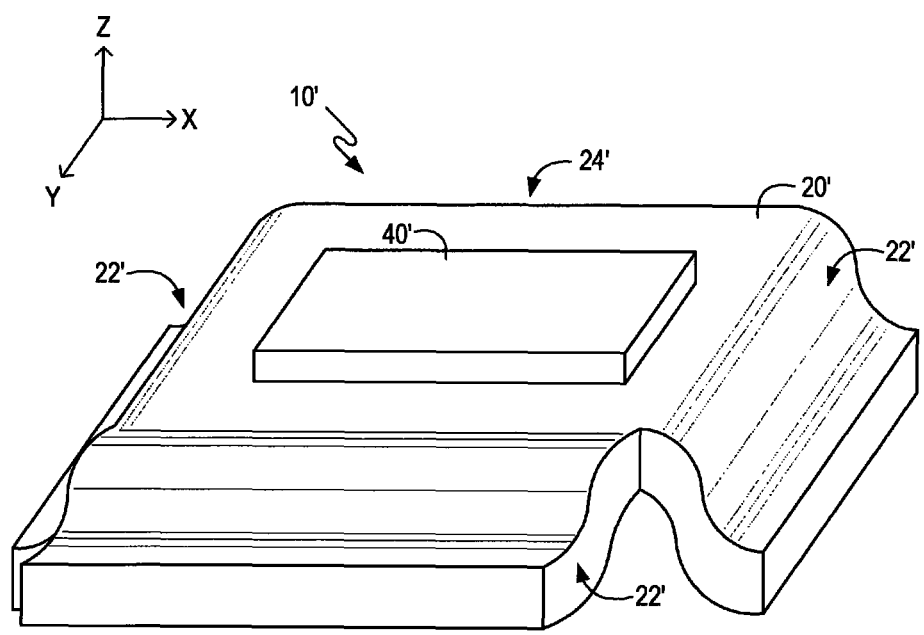
FIG. 3A is a perspective view schematic diagram of an electronic assembly comprising an electronic device mounted on a substrate comprising a non-planar low-temperature co-fired ceramic, wherein the substrate also comprises four peripheral S-shaped arcuate sections separated by a planar section.
Figure 3B:
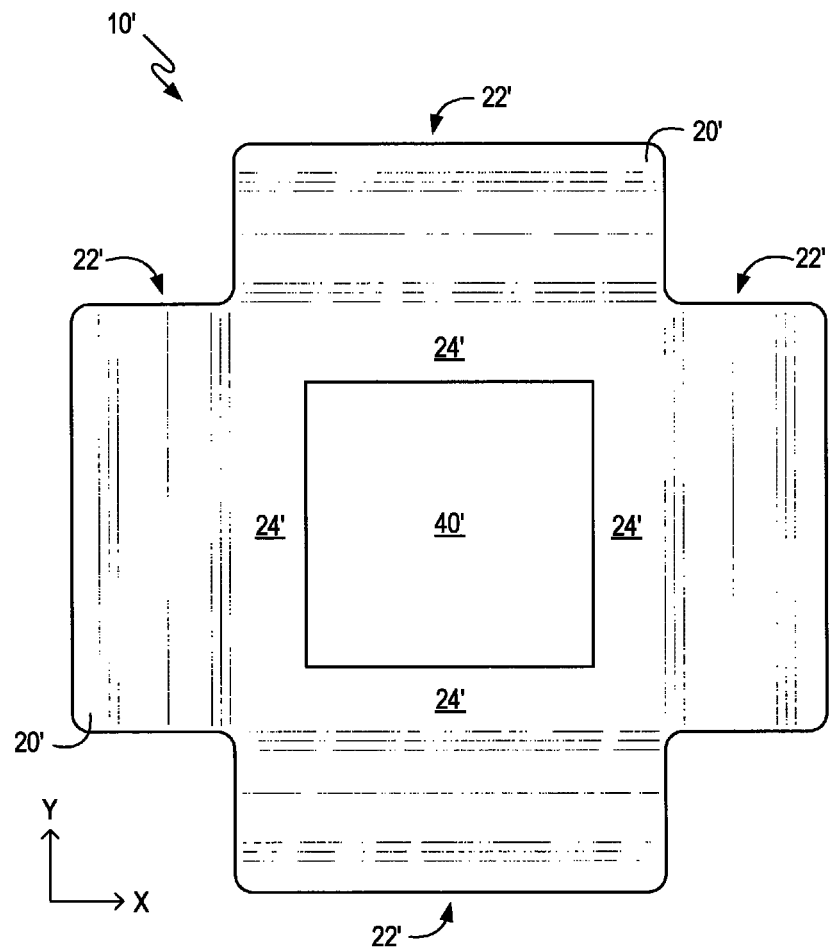
FIG. 3B is a top view schematic diagram of the electronic assembly shown in FIG. 3A.

Although the cross-sectional views of the substrates 20 in FIGS. 1A-1F only show two arcuate sections 22, it is understood that the electronic assemblies can comprise non-planar substrates comprising more than two arcuate sections. For example, referring to FIGS. 3A and 3B, an electronic assembly 10' comprises a substrate 20' comprising a non-planar low-temperature co-fired ceramic and at least one internal electrical conductor (not shown). The substrate 20' comprises four arcuate sections 22' separated by a planar section 24'. The electronic assembly 10' also comprises an electronic device 40' mounted on the substrate 20' in the planar section 24'. The four arcuate sections 22' are located at the periphery of the planar section 24'. It is noted that the cross-sectional view of the electronic assembly 10*a* shown in FIG. 1A could correspond to views of the electronic assembly 10' shown in FIG. 3A through either the X-Z plane or the Y-Z plane.

Although the electronic assemblies shown in FIGS. 1A-3B comprise non-planar substrates having S-shaped arcuate sections, it is understood that the electronic assemblies can comprise non-planar substrates having arcuate sections of any shape suitable for the mounting of the non-planar substrates on another substrate and for providing an electrically interconnecting standoff between two or more electronic devices. For example, an electronic assembly can comprise a non-planar substrate comprising arcuate sections each independently comprising S-shaped sections, J-shaped sections, and C-shaped sections.

Figure 4:
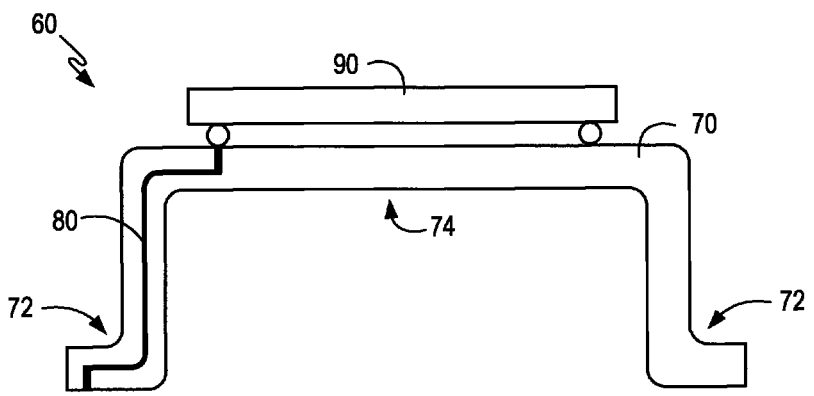
FIG. 4 is a cross-sectional schematic diagram of an electronic assembly comprising an electronic device mounted on a substrate comprising a non-planar low-temperature co-fired ceramic and at least one internal electrical conductor, wherein the substrate also comprises J-shaped arcuate sections separated by a planar section.

Referring to FIG. 4, an electronic assembly 60 comprises a substrate 70 comprising a non-planar low-temperature co-fired ceramic and at least one internal electrical conductor 80 embedded within the LTCC substrate material. The substrate 70 comprises two J-shaped arcuate sections 72 separated by a planar section 74. The electronic assembly 60 also comprises an electronic device 90 mounted on the substrate 70 in the planar section 74 and electrically coupled to the internal electrical conductor 80. Although the cross-sectional view of the substrate 70 in FIG. 4 only shows two J-shaped arcuate sections 72, it is understood that the non-planar substrate 70 of the electronic assembly 60 can comprise two or more arcuate sections, such as, for example, 4 J-shaped sections, 2 J-shaped sections and 2 S-shaped sections, or any combination of shaped arcuate sections.

Figure 5:
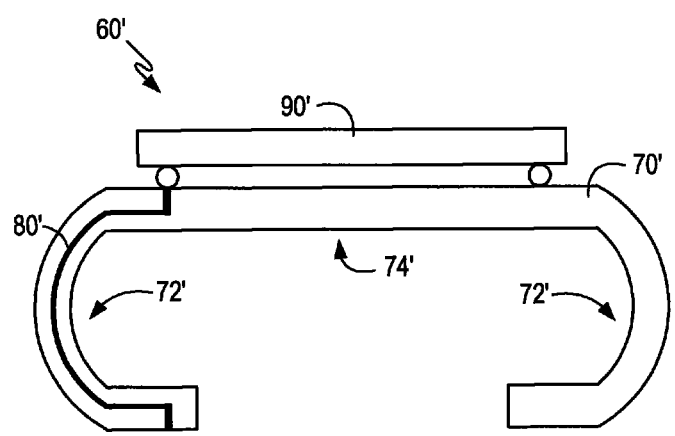
FIG. 5 is a cross-sectional schematic diagram of an electronic assembly comprising an electronic device mounted on a substrate comprising a non-planar low-temperature co-fired ceramic and at least one internal electrical conductor, wherein the substrate also comprises C-shaped arcuate sections separated by a planar section.

Referring to FIG. 5, an electronic assembly 60' comprises a substrate 70' comprising a non-planar low-temperature co-fired ceramic and at least one internal electrical conductor 80' embedded within the LTCC substrate material. The substrate 70' comprises two C-shaped arcuate sections 72' separated by a planar section 74'. The electronic assembly 60' also comprises an electronic device 90' mounted on the substrate 70' in the planar section 74' and electrically coupled to the internal electrical conductor 80'. Although the cross-sectional view of the substrate 70' in FIG. 5 only shows two C-shaped arcuate sections 72', it is understood that the non-planar substrate 70' of the electronic assembly 60' can comprise two or more arcuate sections, such as, for example, 4 C-shaped sections, 2 C-shaped sections and 2 S-shaped sections, 2 C-shaped sections and 2 J-shaped sections, or any combination of shaped arcuate sections.

Figure 6:
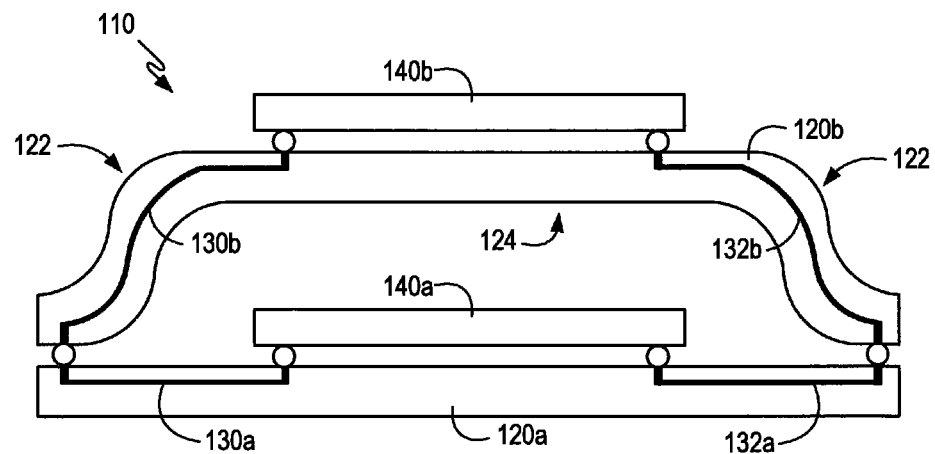
FIG. 6 is a cross-sectional schematic diagram of an electronic assembly comprising a first substrate comprising at least one internal electrical conductor, a first electronic device mounted on the first substrate and electrically coupled to the at least one internal electrical conductor in the first substrate, a second substrate comprising a non-planar low-temperature co-fired ceramic and at least one internal electrical conductor, and a second electronic device mounted on the second substrate and electrically coupled to the at least one internal electrical conductor in the second substrate.

As shown in FIGS. 1A-1F, 4, and 5, the electronic devices are mounted on the substrates and electrically coupled to the internal electrical conductors in the planar sections, and the internal electrical conductors extend from the planar sections through an arcuate section to the bottom side surface of the substrates in the arcuate section. This structure facilitates the mounting of the non-planar substrates on another substrate and the functioning of the non-planar substrates as an electrically interconnecting standoff between two or more electronic devices. FIG. 6 shows an electronic assembly 110 comprising first and second substrates 120*a* and 120*b*, wherein the second substrate 120*b* is mounted on the first substrate 120*a*, and wherein the second substrate 120*b* functions as an electrically interconnecting standoff between first and second electronic devices 140*a* and 140*b*, which are respectively mounted to the first and second substrates 120*a* and 120*b*.

The first substrate 120*a* is a planar substrate and optionally comprises a low temperature co-fired ceramic, but could alternatively comprise a different material of construction, such as, for example, silicon, a non-LTCC glass-based material, a non-LTCC ceramic-based material, or a plastic material. The first substrate 120*a* comprises internal electrical conductors 130*a* and 132*a* embedded within the substrate material. The internal electrical conductors 130*a* and 132*a* each extend between different locations on the top side surface of the first substrate 120*a*. The first electronic device 140*a* is mounted on the top side of first substrate 120*a* and is electrically coupled to the internal electrical conductors 130*a* and 132*a*.

The second substrate 120*b* is a non-planar substrate comprising a non-planar low-temperature co-fired ceramic material of construction. The second substrate 120*b* comprises internal electrical conductors 130*b* and 132*b* embedded within the LTCC substrate material. The second substrate 120*b* comprises at least two arcuate end sections 122 separated by a planar section 124. The internal electrical conductors 130*b* and 132*b* each extend from a location on the top side surface of the second substrate 120*b*, through the planar section 124 and the arcuate section 122, to a location on the bottom side surface of the second substrate 120*b*. The second electronic device 140*b* is mounted on the top side of the second substrate 120*b* in the planar section 124 and is electrically coupled to the internal electrical conductors 130*b* and 132*b*.

The second substrate 120*b* is mounted on the first substrate 120*a* and is positioned over the first electronic device 140*a*, thus providing standoff between the first and second electronic devices 140*a* and 140*b*. The second substrate 120*b* is mounted on the first substrate 120*a* at the two arcuate sections 122 (it is understood that the second substrate 120*b* could be mounted on the first substrate 120*a* at more than two arcuate sections, not shown). The internal electrical conductors 130*b* and 132*b* embedded within the LTCC material of the second substrate 120*b* are electrically coupled to the internal electrical conductors 130a and 132a embedded within the material (optionally, LTCC material) of the first substrate 120a.

Figure 7:
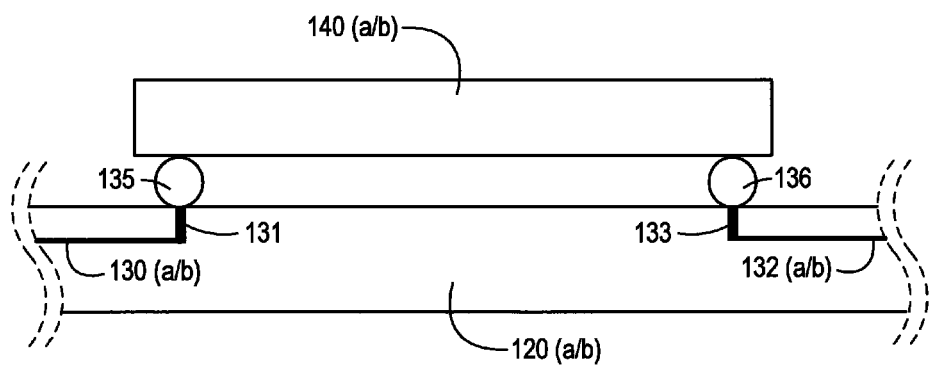
FIG. 7 is a cross-sectional schematic diagram showing the electrical coupling (with solder bumps) of an electronic device to a substrate comprising internal electrical conductors.

The electronic devices can be electrically coupled to the internal electrical conductors embedded within the substrate material (e.g., embedded within LTCC material) using any suitable electrical couplings, such as, for example, solder bumps or wire bonding. For instance, FIGS. 1A-1F and 4-6 show the electronic devices electrically coupled to the internal electrical conductors using solder bumps (e.g., flip chip configurations). Referring to FIG. 7, the first and second substrates 120a/120b comprise vias 131 and 133 electrically connected to the internal electrical conductors 130a/130b and 132a/132b, respectively, and extending to the top side surfaces of the substrates (via pads may be located on the top side surfaces of the substrates, but are omitted from FIG. 7 for sake of clarity). A solder bump 135 is positioned between and in electrical contact with a pad (not shown) on the bottom side surfaces of the electronic devices 140a/140b and the via 131 (or via pad, not shown). A solder bump 136 is positioned between and in electrical contact with a pad (not shown) on the bottom side surfaces of the electronic devices 140a/140b and the via 133 (or via pad, not shown). The solder bumps 135/136 and the vias 131/133 electrically couple the electronic devices 140a/140b to the internal electrical conductors 130a/130b and 132a/132b.

Figure 9:
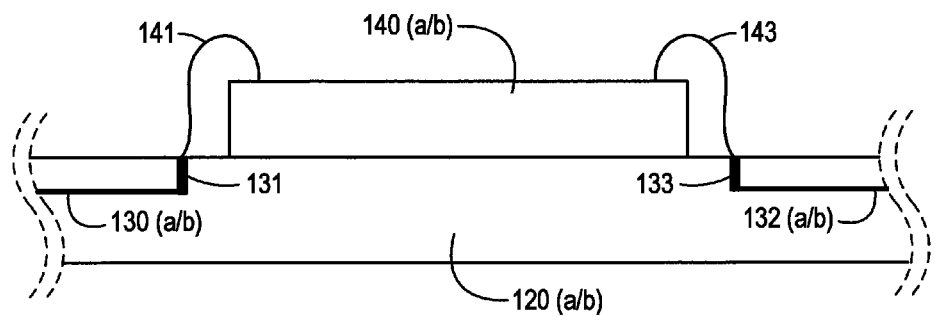
FIG. 9 is a cross-sectional schematic diagram showing the electrical coupling (with wires) of an electronic device to a substrate comprising internal electrical conductors.

Accordingly, the first substrate 120a and/or the second substrate 120b can comprise at least one via 131 or 133, and the first electronic device 140a and/or the second electronic device 140b can be electrically connected to the at least one via 131 or 133. As shown in FIG. 7, the first electronic device 140a and/or the second electronic device 140b can be electrically connected to the vias 131 and 133 with solder bumps 135 and 136. Alternatively, as shown in FIG. 9, the first electronic device 140a and/or the second electronic device 140b can be electrically connected to the vias 131 or 133 with wires 141 and 143. Thus, in any implementation of the electronic assemblies described in this specification, the electronic devices can be electrically coupled to the internal electrical conductors embedded within the substrate material (e.g., embedded within LTCC material) using solder bumping or wire bonding, for example.

Figure 8:
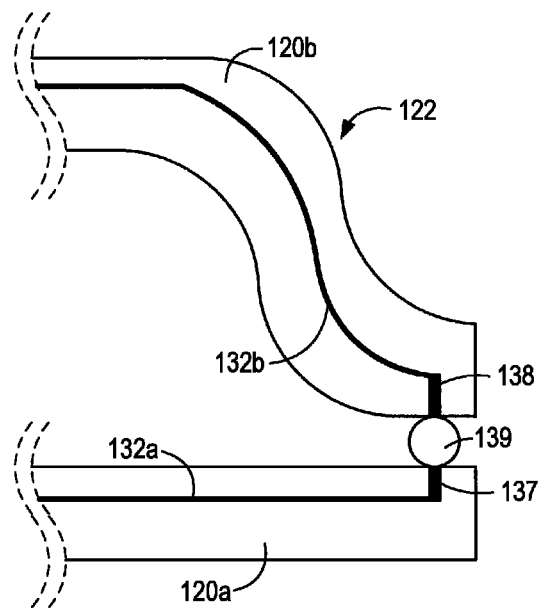
FIG. 8 is a cross-sectional schematic diagram showing the electrical coupling (with solder bumps) of two stacked substrates comprising internal electrical conductors.

Similarly, in implementations comprising a second substrate mounted on a first substrate, the internal electrical conductors embedded within the substrates can be electrically coupled using solder bumping or wire bonding. For example, referring to FIG. 8, the second substrate 120b is shown mounted on the first substrate 120a at the arcuate sections 122 of the second substrate 120b. The first substrate 120a comprises a via 137 electrically connected to the internal electrical conductor 132a. The second substrate 120b comprises a via 138 electrically connected to the internal electrical conductor 132b. A solder bump 139 is positioned between and in electrical contact with the vias 137 and 138 (or via pads, not shown). The solder bumps 139 and the vias 137 and 138 electrically couple the internal electrical conductors 132a and 132b.

Accordingly, the first substrate 120a and/or the second substrate 120b can comprise at least one via 137 or 138, and the internal electrical conductors 132a and 132b, respectively embedded in the substrates 120a and 120b, can be electrically coupled together with the solder bump 139. Similarly, the first substrate 120a and/or the second substrate 120b can comprise vias that electrically connect the internal electrical conductors 130a and 130b using solder bumping or wire bonding, for example.

The electronic assembly shown in FIG. 6 comprises two substrates and two electronic devices in a vertically-stacked configuration. However, it is understood that electronic assemblies in accordance with this specification can comprise any number of substrates and electronic devices. For example, FIG. 10 shows an electronic assembly 110', similar to the electronic assembly 110 shown in FIG. 6, but further comprising a third substrate 120c and a third electronic device 140c.

The third substrate 120c is a non-planar substrate comprising a non-planar low-temperature co-fired ceramic material of construction. The third substrate 120c comprises internal electrical conductors 130c and 132c embedded within the LTCC substrate material. The third substrate 120c comprises at least two arcuate end sections 122c separated by a planar section 124c. The internal electrical conductors 130c and 132c each extend from a location on the top side surface of the third substrate 120c, through the planar section 124c and the arcuate section 122c, to a location on the bottom side surface of the third substrate 120c. The third electronic device 140c is mounted on the top side of the third substrate 120c in the planar section 124c and is electrically coupled to the internal electrical conductors 130c and 132c (using vias and solder bumps, for example, or alternatively wire bonding, not shown).

The third substrate 120c is mounted on the second substrate 120b and is positioned over the second electronic device 140b, thus providing standoff between the second and third electronic devices 140b and 140c. The third substrate 120c is mounted on the second substrate 120b at the two arcuate sections 122c of the third substrate 120c and the planar section 124 of the second substrate 120b (it is understood that the third substrate 120c could be mounted on the second substrate 120b at more than two arcuate sections, not shown). The internal electrical conductors 130c and 132c embedded within the LTCC material of the third substrate 120c are electrically coupled to the internal electrical conductors 130b and 132b embedded within the LTCC material of the second substrate 120b (using vias and solder bumps, for example, or alternatively wire bonding, not shown). The first, second, and third electronic devices 140a, 140b, and 140c are electrically coupled through the first, second, and third substrates 120a, 120b, and 120c.

Figure 10:
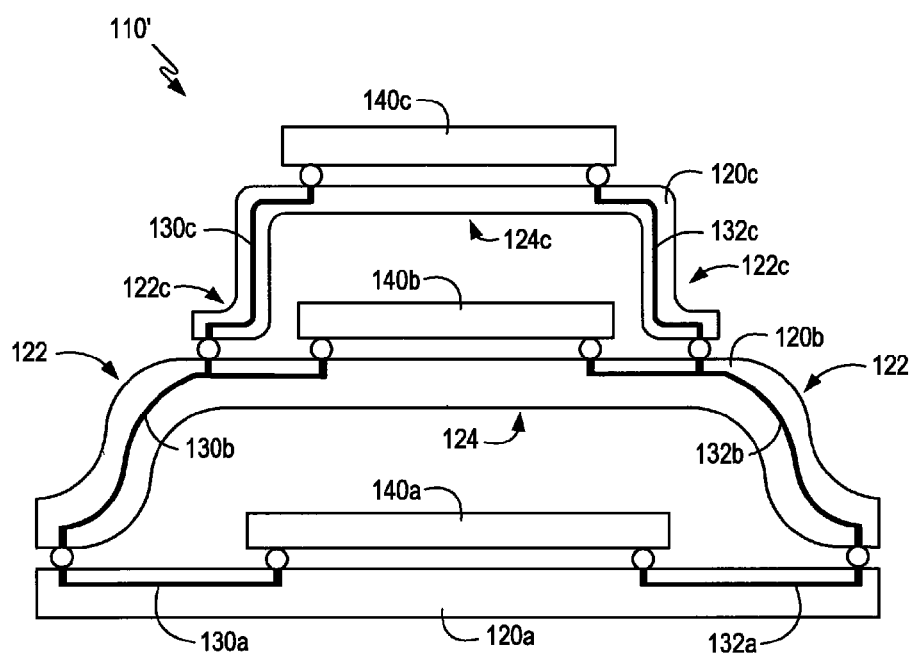
FIG. 10 is a cross-sectional schematic diagram of an electronic assembly comprising three electronic devices mounted to, and electrically coupled through, three substrates in a vertically-stacked configuration.
Figure 11:
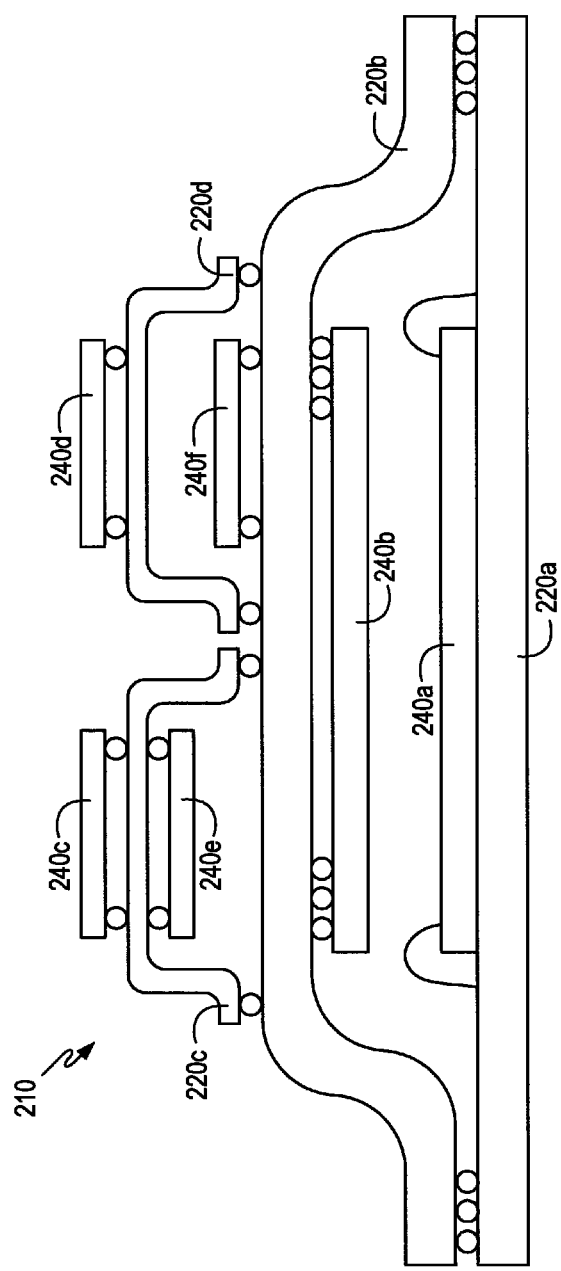
FIG. 11 is a cross-sectional schematic diagram of an electronic assembly comprising six electronic devices mounted to, and electrically coupled through, four substrates in a combined vertically stacked and horizontally stacked configuration.

Although FIGS. 6 and 10 show electronic assemblies comprising multiple vertically-stacked substrates with top side-mounted electronic devices, it is understood that the electronic assemblies described in this specification can comprise vertically-stacked and horizontally-stacked substrates with top side-mounted and bottom-side mounted electronic devices. For example, referring to FIG. 11, an electronic assembly 210 comprises four substrates 220a-220d, and six electronic devices 240a-240f, with a combination of vertical and horizontal stacking.

The electronic device 240a is mounted on the top side of the planar substrate 220a. The electronic device 240b is mounted on the bottom side of the non-planar substrate 220b, and the electronic device 240f is mounted on the top side of the non-planar substrate 220b. The electronic device 240c is mounted on the top side of the non-planar substrate 220c, and the electronic device 240e is mounted on the bottom side of the non-planar substrate 220c. The electronic device 240d is mounted on the top side of the non-planar substrate 220d.

The non-planar substrate 220b is mounted on the planar substrate 220a and positioned over the electronic device 240a. The non-planar substrate 220c is mounted on the non-planar substrate 220b. The non-planar substrate 220d is mounted on the non-planar substrate 220*b* and positioned over the electronic device 240*f*. Accordingly, between substrate levels, the substrates 220*a*, 220*b*, and 220*c* (and the electronic devices 240*a*, 240*b*, 240*e*, and 240*c*) are vertically stacked. Likewise, between substrate levels, the substrates 220*a*, 220*b*, and 220*d* (and the electronic devices 240*a*, 240*b*, 240*f*, and 240*d*) are vertically-stacked. Within substrates levels, the substrates 220*c* and 220*d* (and the electronic devices 240*c*, 240*d*, 240*e*) are horizontally stacked.

The substrates 220*a*-220*d* can comprise a low-temperature co-fired ceramic material of construction and internal electrical conductors (not shown) embedded within the LTCC substrate material. The internal electrical conductors embedded within the planar substrate 220*a* are electrically coupled to the internal electrical conductors embedded within the non-planar substrate 220*b*. The internal electrical conductors embedded within the non-planar substrate 220*b* are electrically coupled to the internal electrical conductors embedded within the non-planar substrate 220*c*. The internal electrical conductors embedded within the non-planar substrate 220*b* are also electrically coupled to the internal electrical conductors embedded within the non-planar substrate 220*d*. The electronic devices 240*a*-240*f* are respectively electrically coupled to the internal electrical conductors embedded within the substrates 220*a*-220*d*. Thus, the electronic devices 240*a*-240*f*, or any sub-combinations thereof, are electrically coupled through the substrates 220*a*-220*d*.

Figure 12:
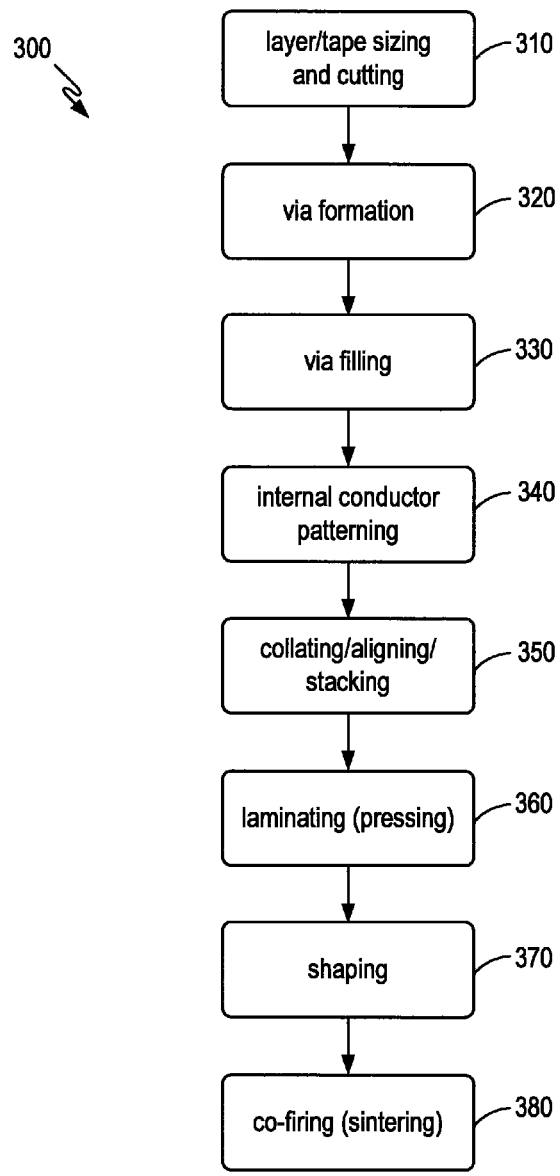
FIG. 12 is a flow diagram illustrating a process for producing a substrate comprising a non-planar low-temperature co-fired ceramic and internal electrical conductors.

The non-planar substrates comprising a non-planar low-temperature co-fired ceramic material of construction and internal electrical conductors embedded within the LTCC substrate material can be produced by introducing a shaping step between the laminating and co-firing steps in the LTCC production process. Referring to FIG. 12, a process 300 for producing a non-planar substrate comprising a non-planar low-temperature co-fired ceramic and internal electrical conductors comprises a sizing and cutting step 310. In step 310, the individual layers that will collectively form the LTCC material of the substrate are obtained by cutting unfired tape stock into two-dimensional preform sheets having a size and shape corresponding to the specific substrate design. At step 320, via holes are formed through the thicknesses of the preform sheets according to the specific substrate design. The via holes can be formed, for example, by mechanically punching holes through the preform sheets at the appropriate locations. At step 330, the via holes in the individual preform sheets are filled with electrically conductive material, such as, for example, copper, silver, or gold pastes. At step 340, the internal electrical conductors are deposited as patterns on the surfaces of the individual preform sheets, using, for example, copper, silver, or gold pastes and thick film screen printing techniques.

Still referring to FIG. 12, at step 350, the individual preform sheets are collated, aligned, and stacked together, ensuring the alignment of filled via holes in adjacent sheets and the internal electrical conductor pattern. At step 360, the preform layer stack is laminated together by pressing the stack with either uniaxial or isostatic pressure. After the lamination step, the laminated stack is in a "green" state in which the individual layers adhere to each other, but the stack is still relatively pliable. At step 370, the green laminate is formed into the non-planar shape of the specific substrate design. At step 380, the formed/shaped green laminate is co-fired using an increasing-decreasing temperature profile (e.g., peaking at a temperature in the range of 800-900° C.) over a co-firing period that depends on the specific chemical composition of the glass and ceramic materials of the unfired tape stock. During the co-firing step 380, organic components of the unfired tape stock and the conductor pastes burn-out of the green laminate, the glass and ceramic components of the individual component sheets sinter together to from the monolithic structure, and the conductor pastes metallize into the embedded vias and internal electrical conductors. Thus, during the co-firing step 380, the formed/shaped green laminate transforms into the non-planar substrate comprising a non-planar low-temperature co-fired ceramic material of construction and internal electrical conductors embedded within the LTCC substrate material.

Figure 13:
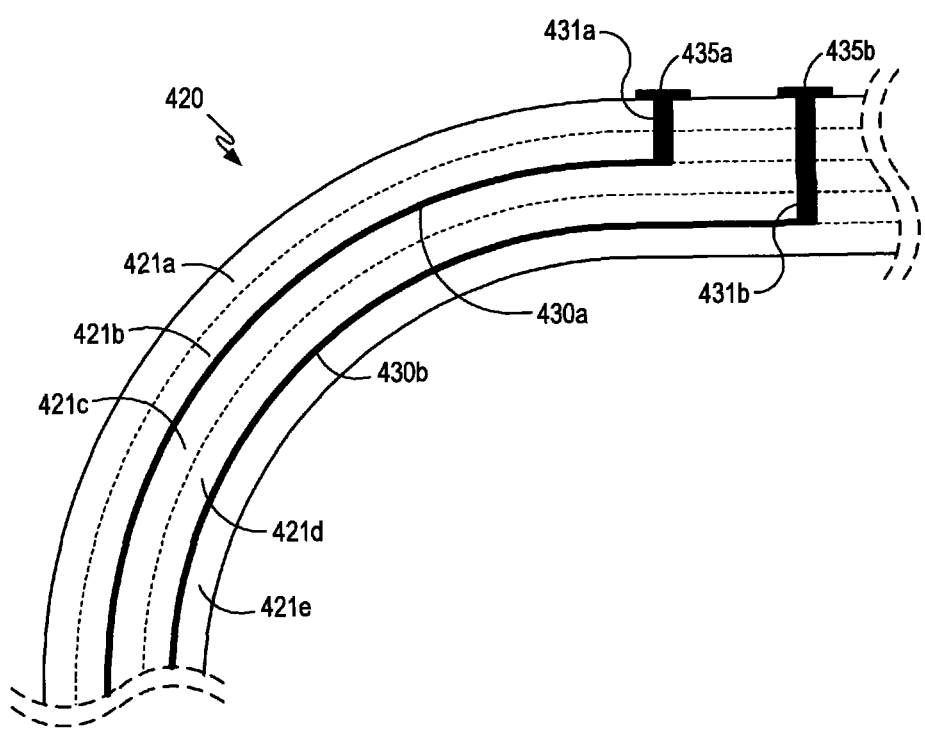
FIG. 13 is a cross-sectional schematic diagram of a substrate comprising a non-planar low-temperature co-fired ceramic and internal electrical conductors.

Referring to FIG. 13, a substrate 420 comprises a non-planar low-temperature co-fired ceramic and internal electrical conductors 430*a* and 430*b* embedded within the LTCC substrate material. The substrate 420 is produced from five individual preform sheets and therefore comprises five component layers 421*a*-421*e* that are laminated and sintered together into the monolithic substrate. The internal electrical conductor 430*a* is embedded between internal layers 421*b* and 421*c*. The internal electrical conductor 430*a* is therefore produced from a conductor pattern that was deposited on a preform sheet collated third from the top of the preform stack. The internal electrical conductor 430*b* is embedded between internal layer 421*d* and external 421*e*. The internal electrical conductor 430*b* is therefore produced from a conductor pattern that was deposited on a preform sheet collated at the bottom of the preform stack. The component layers 421*a*-421*e* of the substrate 420 do not exhibit delamination, even between layers immediately adjacent to and in direct contact with the embedded internal electrical conductors, despite the non-planar shape of the substrate 420.

Still referring to FIG. 13, the internal electrical conductor 430*a* is electrically connected to a via 431*a*, which is connected to a via pad 435*a* located on the top surface of the substrate 420. The via 431*a* extends from the via pad 435*a*, through the component layers 421*a* and 421*b*, to the internal electrical conductor 430*a*. The via 431*a* is therefore produced from filled via holes punched through the two preform sheets collated and aligned first and second from the stop of the preform stack. The internal electrical conductor 430*b* is electrically connected to a via 431*b*, which is connected to a via pad 435*b* located on the top surface of the substrate 420. The via 431*b* extends from the via pad 435*b*, through the component layers 431*a*-421*d*, to the internal conductor 430*b*. The via 431*b* is therefore produced from filled via holes punched through the four preform sheets collated and aligned first through fourth from the stop of the preform stack.

The stacked and electrically-coupled substrates of the electronic assemblies described in this specification facilitate the point-to-point electrical connection between discrete electronic devices in a three-dimensional package. In this manner, the stacked and electrically-coupled substrates function similar to silicon interposers in 2.5D (horizontally-stacked) packages, and eliminate the need for TSVs in 3D (vertically-stacked) packages. Indeed, none of the electronic assemblies shown in FIGS. 1A-11 comprise any through-silicon vias. As described above, the substrates function as an electrically interconnecting standoff between two or more electronic devices. In this manner, the substrates provide glass-ceramic metal vias (GCMVs) as substitutes for more expensive TSVs in the production of multi-layer 3D microelectronic packages.

The specific layout of the internal electrical conductors and vias embedded in the LTCC material of the substrates will depend upon the specific architecture and function of the electronic assemblies (e.g., the number, types, structures, and connectivity of the electronic devices). As described above, specific electronic devices that may be useful in implementations of the electronic assemblies include, but are not limited to, semiconductor integrated circuit wafers, semiconductor integrated circuit dies, integrated circuit chips (e.g., application-specific integrated circuit (ASIC) chips) and chip scale packages (e.g., system on a chip, SoC), multichip modules, memory modules, surface-mount devices (SMDs), integrated passive devices (IPDs), radio frequency (RF) modules, and the like.

The electronic assemblies described in this specification may be used to combine conventionally incompatible electronic devices in a single, heterogeneously integrated package. Therefore, the electronic assemblies described in this specification may be particularly useful for the production of "system in package" (SiP) architectures. The electronic assemblies also may be useful for the production of hermetically sealed packages. By providing electrical interconnection and standoff between two or more vertically-stacked electronic devices, the electronic assemblies described in this specification facilitate package integration in the vertical (Z) dimension and package miniaturization in the horizontal (X and Y) dimensions. The electronic assemblies may also be useful in microelectromechanical systems (MEMS), which may require unconventional 3D microelectronic packages.

Examples

Various features and characteristics of examples of the invention include, but are not limited to, the following numbered clauses:

1. An electronic assembly comprising: a first substrate comprising a low-temperature co-fired ceramic and at least one internal electrical conductor; a first electronic device mounted on the first substrate and electrically coupled to the at least one internal electrical conductor; a second substrate comprising a non-planar low-temperature co-fired ceramic and at least one internal electrical conductor, the second substrate mounted on the first substrate and positioned over the first electronic device, and the at least one internal electrical conductor in the second substrate electrically coupled to the at least one internal electrical conductor in the first substrate; and a second electronic device mounted on the second substrate and electrically coupled to the at least one internal electrical conductor in the second substrate.

2. The electronic assembly of clause 1, wherein the electronic assembly does not comprise any through-silicon vias.

3. The electronic assembly of clause 1 or clause 2, wherein the second substrate comprises two arcuate end sections separated by a planar section.

4. The electronic assembly of clause 3, wherein the two arcuate end sections each independently comprise an S-shaped end section, a J-shaped end section, or a C-shaped end section.

5. The electronic assembly of clause 3 or clause 4, wherein the second substrate is mounted on the first substrate at the two arcuate end sections, and wherein the second electronic device is mounted on the planar section of the second substrate.

6. The electronic assembly of any one of clauses 1-5, wherein the second substrate comprises four arcuate sections separated by a planar section.

7. The electronic assembly of clause 6, wherein the four arcuate sections each independently comprise an S-shaped section, a J-shaped section, or a C-shaped section.

8. The electronic assembly of clause 6 or clause 7, wherein the second substrate is mounted on the first substrate at the four arcuate sections, and wherein the second electronic device is mounted on the planar section of the second substrate.

9. The electronic assembly of any one of clauses 1-8, wherein the first substrate comprises at least one via, and wherein the first electronic device is electrically connected to the at least one via in the first substrate.

10. The electronic assembly of any one of clauses 1-9, wherein the first substrate comprises at least one via and the second substrate comprises at least one via, and wherein the at least one via in the first substrate is electrically connected to the at least one via in the second substrate.

11. The electronic assembly of any one of clauses 1-10, wherein the second substrate comprises at least one via, and the second electronic device is electrically connected to the at least one via in the second substrate.

12. The electronic assembly of any one of clauses 1-11, further comprising: a third substrate comprising a non-planar low-temperature co-fired ceramic and at least one internal electrical conductor, the third substrate mounted on the second substrate and positioned over the second microelectronic device, and the at least one internal electrical conductor in the third substrate electrically coupled to the at least one internal electrical conductor in the second substrate; and a third electronic device mounted on the third substrate and electrically coupled to the at least one internal electrical conductor in the third substrate.

13. The electronic assembly of clause 12, wherein the first, second, and third electronic devices are electrically coupled through the first, second, and third substrates.

14. The electronic assembly of clause 12 or clause 13, wherein the third substrate comprises at least one via, and wherein the third electronic device is electrically connected to the at least one via in the third substrate.

15. The electronic assembly of any one of clauses 12-14, wherein the second substrate comprises at least one via and the third substrate comprises at least one via, and wherein the at least one via in the second substrate is electrically connected to the at least one via in the third substrate 16. The electronic assembly of any one of clauses 1-15, wherein the first electronic device and the second electronic device each comprise a semiconductor integrated circuit die.

17. An electronic assembly comprising: a first substrate comprising a low-temperature co-fired ceramic and at least one internal electrical conductor; a first semiconductor integrated circuit die mounted on the first substrate and electrically coupled to the at least one internal electrical conductor in the first substrate; a second substrate comprising a low-temperature co-fired ceramic, at least one internal electrical conductor, and at least two non-planar sections separated by a planar section, the second substrate mounted on the first substrate at the at least two non-planar sections and positioned over the first semiconductor integrated circuit die, and the at least one internal electrical conductor in the second substrate is electrically coupled to the at least one internal electrical conductor in the first substrate; and a second semiconductor integrated circuit die mounted on the planar section of the second substrate and electrically coupled to the at least one internal electrical conductor in the second substrate; wherein the first and second semiconductor integrated circuit dies are electrically coupled through the first and second substrates.

18. The electronic assembly of clause 17, wherein the electronic assembly does not comprise any through-silicon vias.

19. The electronic assembly of clause 17 or clause 18, wherein the second substrate comprises two arcuate end sections separated by the planar section, wherein the second substrate is mounted on the first substrate at the two arcuate end sections, and wherein the two arcuate end sections each independently comprise an S-shaped end section, a J-shaped end section, or a C-shaped end section.

20. The electronic assembly of any one of clauses 17-19, wherein the second substrate comprises four arcuate sections separated by the planar section, wherein the second substrate is mounted on the first substrate at the four arcuate sections, and wherein the four arcuate sections each independently comprise an S-shaped end section, a J-shaped end section, or a C-shaped end section.

Various features and characteristics of the invention are described in this specification and illustrated in the drawings to provide an overall understanding of the disclosed assemblies, processes, and systems. It is understood that the various features and characteristics described in this specification and illustrated in the drawings can be combined in any suitable manner regardless of whether such features and characteristics are expressly described or illustrated in combination in this specification. The Inventors and the Applicant expressly intend such combinations of features and characteristics to be included within the scope of this specification. As such, the claims can be amended to recite, in any combination, any features and characteristics expressly or inherently described in, or otherwise expressly or inherently supported by, this specification. Furthermore, the Applicant reserves the right to amend the claims to affirmatively disclaim features and characteristics that may be present in the prior art, even if those features and characteristics are not expressly described in this specification. Therefore, any such amendments will not add new matter to the specification or claims, and will comply with written description, sufficiency of description, and added matter requirements (e.g., 35 U.S.C. § 112(a) and Article 123(2) EPC). The assemblies, processes, and systems described in this specification can comprise, consist of, or consist essentially of the various features and characteristics described in this specification.

The grammatical articles "one", "a", "an", and "the", as used in this specification, are intended to include "at least one" or "one or more", unless otherwise indicated. Thus, the articles are used in this specification to refer to one or more than one (i.e., to "at least one") of the grammatical objects of the article. By way of example, "a component" means one or more components, and thus, possibly, more than one component is contemplated and can be employed or used in an implementation of the described processes, compositions, and products. Further, the use of a singular noun includes the plural, and the use of a plural noun includes the singular, unless the context of the usage requires otherwise.

What is claimed is:

1. An electronic assembly, comprising:
   a first substrate comprising a low-temperature co-fired ceramic and an internal electrical conductor;
   a first electronic device mounted on the first substrate, wherein the first electronic device is electrically coupled to the internal electrical conductor in the first substrate;
   a second substrate comprising a low-temperature co-fired ceramic, wherein the second substrate is a non-planar substrate defined by an arcuate section, and wherein an internal electrical conductor extends through the arcuate section in a way that conforms to a shape of the arcuate section; and
   a second electronic device mounted on the second substrate, wherein the second electronic device is electrically coupled to the internal electrical conductor in the second substrate;
   wherein the second substrate is mounted on the first substrate and is positioned over the first electronic device, wherein the internal electrical conductor in the second substrate is electrically coupled to the internal electrical conductor in the first substrate, and wherein the arcuate section of the second substrate provides an electrically interconnecting standoff between the first electronic device and the second electronic device.

2. The electronic assembly of claim 1, wherein the electronic assembly does not comprise any through-silicon vias.

3. The electronic assembly of claim 1, wherein the second substrate is a non-planar substrate defined by two arcuate sections separated by a planar section, wherein one of the two arcuate sections comprises the internal electrical conductor in the second substrate, and wherein the two arcuate sections of the second substrate provide an electrically interconnecting standoff between the first electronic device and the second electronic device.

4. The electronic assembly of claim 3, wherein the two arcuate sections each independently comprise an S-shaped section, a J-shaped section, or a C-shaped section.

5. The electronic assembly of claim 3, wherein the second substrate is mounted on the first substrate at the two arcuate sections, and wherein the second electronic device is mounted on the planar section of the second substrate.

6. The electronic assembly of claim 1, wherein the second substrate is a non-planar substrate defined by four arcuate sections separated by a planar section, wherein one of the four arcuate sections comprises the internal electrical conductor in the second substrate, and wherein the four arcuate sections of the second substrate provide an electrically interconnecting standoff between the first electronic device and the second electronic device.

7. The electronic assembly of claim 6, wherein the four arcuate sections each independently comprise an S-shaped section, a J-shaped section, or a C-shaped section.

8. The electronic assembly of claim 6, wherein the second substrate is mounted on the first substrate at the four arcuate sections, and wherein the second electronic device is mounted on the planar section of the second substrate.

9. The electronic assembly of claim 1, wherein the first substrate comprises at least one via, and wherein the first electronic device is electrically connected to the at least one via in the first substrate.

10. The electronic assembly of claim 1, wherein the first substrate comprises at least one via, wherein the second substrate comprises at least one via, and wherein the at least one via in the first substrate is electrically connected to the at least one via in the second substrate.

11. The electronic assembly of claim 1, wherein the second substrate comprises at least one via, and wherein the second electronic device is electrically connected to the at least one via in the second substrate.

12. The electronic assembly of claim 1, further comprising:
    a third substrate comprising a low-temperature co-fired ceramic, wherein the third substrate is a non-planar substrate defined by an arcuate section, wherein an internal electrical conductor extends through the arcuate section of the third substrate in a way that conforms to a shape of the arcuate section of the third substrate; and a third electronic device mounted on the third substrate, wherein the third electronic device is electrically coupled to the internal electrical conductor in the third substrate;

wherein the third substrate is mounted on the second substrate and is positioned over the second electronic device, wherein the internal electrical conductor in the third substrate is electrically coupled to the internal electrical conductor in the second substrate, and wherein the arcuate section of the third substrate provides an electrically interconnecting standoff between the second electronic device and the third electronic device.

13. The electronic assembly of claim 12, wherein the first, second, and third electronic devices are electrically coupled through the first, second, and third substrates.

14. The electronic assembly of claim 12, wherein the third substrate comprises at least one via, and wherein the third electronic device is electrically connected to the at least one via in the third substrate.

15. The electronic assembly of claim 12, wherein the second substrate comprises at least one via and the third substrate comprises at least one via, and wherein the at least one via in the second substrate is electrically connected to the at least one via in the third substrate.

16. The electronic assembly of claim 1, wherein the first electronic device and the second electronic device each comprise a semiconductor integrated circuit die.

17. An electronic assembly, comprising:
a first substrate comprising a low-temperature co-fired ceramic and an internal electrical conductor;
a first semiconductor integrated circuit die mounted on the first substrate, wherein the first semiconductor integrated circuit die is electrically coupled to the internal electrical conductor in the first substrate;
a second substrate comprising a low-temperature co-fired ceramic, wherein the second substrate is a non-planar substrate defined by at least two curved sections separated by a flat section, wherein an internal electrical conductor extends through one of the curved sections in a way that conforms to a shape of that curved section; and a second semiconductor integrated circuit die mounted on the flat section of the second substrate, wherein the second semiconductor integrated circuit die is electrically coupled to the internal electrical conductor in the second substrate;

wherein the second substrate is mounted on the first substrate at the at least two curved sections and is positioned over the first semiconductor integrated circuit die, wherein the internal electrical conductor in the second substrate is electrically coupled to the internal electrical conductor in the first substrate to electrically couple the first semiconductor integrated circuit die to the second semiconductor integrated circuit die, and wherein the at least two curved sections of the second substrate provide an electrically interconnecting standoff between the first semiconductor integrated circuit die and the second semiconductor integrated circuit die.

18. The electronic assembly of claim 17, wherein the electronic assembly does not comprise any through-silicon vias.

19. The electronic assembly of claim 17, wherein the at least two curved sections comprise two curved sections separated by the flat section, wherein one of the two curved sections comprises the internal electrical conductor in the second substrate, wherein the two curved sections of the second substrate provide an electrically interconnecting standoff between the first semiconductor integrated circuit die and the second semiconductor integrated circuit die, and wherein the two curved sections each independently comprise an S-shaped section, a J-shaped section, or a C-shaped section.

20. The electronic assembly of claim 17, wherein the at least two curved sections comprise four curved sections separated by the flat section, wherein one of the four curved sections comprises the internal electrical conductor in the second substrate, wherein the four curved sections of the second substrate provide an electrically interconnecting standoff between the first semiconductor integrated circuit die and the second semiconductor integrated circuit die, and wherein the four curved sections each independently comprise an S-shaped section, a J-shaped section, or a C-shaped section.

* * * * *